United States Patent
Kim

(10) Patent No.: US 9,019,781 B2
(45) Date of Patent: Apr. 28, 2015

(54) INTERNAL VOLTAGE GENERATION CIRCUIT

(75) Inventor: Keun Kook Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 593 days.

(21) Appl. No.: 13/336,875

(22) Filed: Dec. 23, 2011

(65) Prior Publication Data

US 2013/0033944 A1 Feb. 7, 2013

(30) Foreign Application Priority Data

Aug. 5, 2011 (KR) .................. 10-2011-0078293

(51) Int. Cl.
| | |
|---|---|
| G11C 7/06 | (2006.01) |
| G11C 11/4074 | (2006.01) |
| G11C 11/406 | (2006.01) |
| G11C 5/14 | (2006.01) |

(52) U.S. Cl.
CPC ...... *G11C 11/4074* (2013.01); *G11C 11/40615* (2013.01); *G11C 5/145* (2013.01); *G11C 5/147* (2013.01)

(58) Field of Classification Search
CPC ........ G11C 7/1006; G11C 7/14; G11C 7/062; G11C 11/4074
USPC .......... 365/189.07, 189.09, 189.11, 226, 227, 365/228
See application file for complete search history.

(56) References Cited

U.S. PATENT DOCUMENTS

| | | | |
|---|---|---|---|
| 2002/0041531 A1* | 4/2002 | Tanaka et al. ................. | 365/205 |
| 2004/0022114 A1* | 2/2004 | Morishita et al. ............. | 365/226 |
| 2005/0007851 A1* | 1/2005 | Takahashi et al. ............ | 365/222 |
| 2005/0030086 A1* | 2/2005 | Sim et al. ...................... | 327/534 |
| 2006/0146616 A1* | 7/2006 | Heo et al. ................. | 365/189.09 |
| 2006/0285401 A1* | 12/2006 | Pan ......................... | 365/189.09 |
| 2009/0224823 A1* | 9/2009 | Gyohten et al. ............. | 327/538 |
| 2010/0008173 A1* | 1/2010 | Im ................................ | 365/222 |

FOREIGN PATENT DOCUMENTS

| | | |
|---|---|---|
| KR | 1020070019066 A | 2/2007 |
| KR | 1020080003028 A | 1/2008 |
| KR | 1020110002284 A | 1/2011 |
| KR | 1020110076677 A | 7/2011 |

* cited by examiner

*Primary Examiner* — Son Dinh
*Assistant Examiner* — Uyen B Tran
(74) *Attorney, Agent, or Firm* — William Park & Associates Ltd.

(57) ABSTRACT

An internal voltage generation circuit includes: a selection unit configured to select one of first and second reference voltages as a selection reference voltage in response to a self refresh signal and a power-down mode signal and output the selection reference voltage; a driving signal generation unit configured to compare the selection reference voltage with a negative word line voltage applied to an unselected word line and generate a driving signal; and a driving unit configured to change the negative word line voltage in response to the driving signal.

10 Claims, 3 Drawing Sheets

INTERNAL VOLTAGE GENERATION CIRCUIT

CROSS-REFERENCES TO RELATED APPLICATIONS

The present application claims priority under 35 U.S.C 119(a) to Korean Application No. 10-2011-0078293, filed on Aug. 5, 2011, in the Korean intellectual property Office, which is incorporated herein by reference in its entirety set forth in full.

BACKGROUND

To perform an internal operation, a semiconductor memory device receives an external voltage such as a supply voltage VDD and a ground voltage VSS from outside, and generates an internal voltage to be used for the internal operation. The internal voltage of the memory device may include a core voltage VCORE supplied to a memory core region, a high voltage VPP used for driving a word line, and a back bias voltage VBB supplied as a bulk voltage of an NMOS transistor of the core region.

The core voltage VCORE may be generated by lowering the supply voltage VDD to a predetermined level. However, the high voltage VPP has a higher level than the supply voltage VDD inputted from outside, and the back bias voltage VBB has a lower level than the ground voltage VSS inputted from outside. Therefore, a charge pump circuit is required to supply charges for generating the high voltage VPP and the back bias voltage VBB.

An internal voltage used in a semiconductor memory device may include a negative word line voltage VNWL. The negative word line voltage VNWL is a voltage which is supplied to a word line in a state such as a precharge state in which the word line is not selected, and maintains a lower level than the ground voltage VSS to thereby reduce a leakage current without increasing the threshold voltage of a memory cell transistor.

However, because the negative word line voltage VNWL is generated using the charge pump, as the absolute value of the negative word line voltage VNWL increases, power consumption increases. Further, if a bridge occurs between a word line and a bit line in a state in which the negative word line voltage VNWL is applied to the word line, a potential difference across the bridge increases in proportion to the absolute value of the negative word lines voltage VNWL. Therefore, as the absolute value of the negative word line voltage VNWL increases, a leakage current due to the bridge increases.

SUMMARY

An embodiment of the present invention relates to an internal voltage generation circuit capable of reducing a power consumption at a charge pump in a self refresh mode or power-down mode, and reducing a leakage current occurring, if a bridge occurs between a word line and a bit line, by reducing the absolute value of a negative word line voltage in a self refresh mode or power-down mode.

In an embodiment, an internal voltage generation circuit includes: a selection unit configured to select one of first and second reference voltages as a selection reference voltage in response to a self refresh signal and a power-down mode signal and output the selection reference voltage; a driving signal generation unit configured to compare the selection reference voltage with a negative word line voltage applied to an unselected word line and generate a driving signal; and a driving unit configured to drive the negative word line voltage to a back bias voltage lower than a ground voltage, in response to the driving signal.

In an embodiment, an internal voltage generation circuit includes: a selection unit configured to select one of first and second reference voltages as a selection reference voltage in response to a self refresh signal and a power-down mode signal and output the selection reference voltage; a comparison unit configured to compare the selection reference voltage with a negative word line voltage applied to an unselected word line and generate a detection signal; an oscillator configured to generate a periodic signal in response to the detection signal; and a charge pump configured to pump the negative word line voltage in response to the periodic signal.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, the embodiments are for illustrative purposes only and are not intended to limit the scope of the invention.

Figure 1:
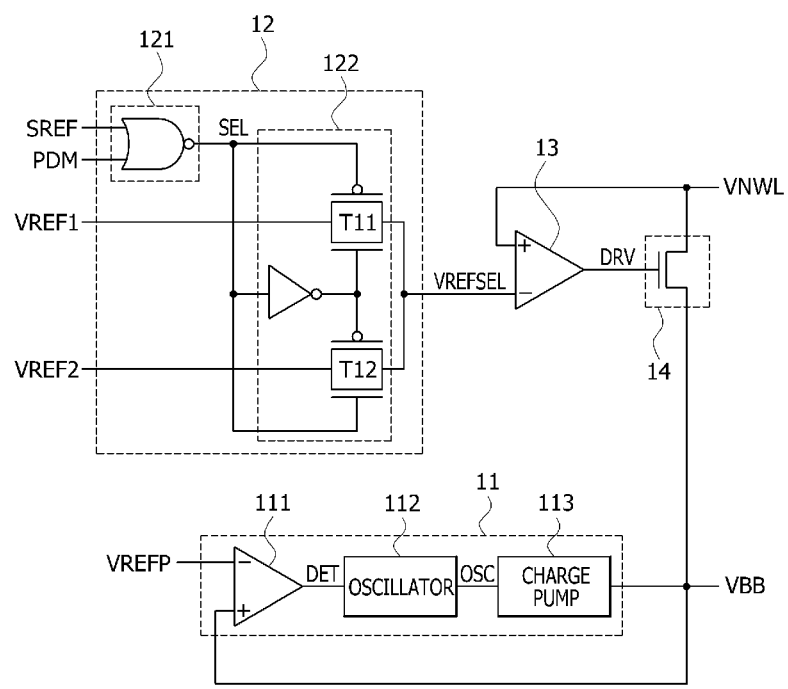
FIG. 1 is a circuit diagram of an internal voltage generation circuit in accordance with an embodiment of the present invention.

FIG. 1 is a circuit diagram of an internal voltage generation circuit in accordance with an embodiment of the present invention.

Referring to FIG. 1, the internal voltage generation circuit in accordance with an embodiment of the present invention includes a pumping circuit 11, a selection unit 12, a driving signal generation unit 13, and a driving unit 14.

The pumping circuit 11 includes a comparison section 111, an oscillator 112, and a charge pump 113. The comparison section 111 is configured to generate a detection signal DET which is enabled to a logic high level when a fed-back back bias voltage VBB has a higher level than a pumping reference voltage VREFP. The oscillator 112 is configured to generate a periodic signal OSC when the detection signal DET is enabled. The charge pump 113 is configured to pump the back bias voltage VBB when the periodic signal OSC is inputted. The back bias voltage VBB generated by the pumping circuit 11 has a lower level than the ground voltage VSS.

The selection unit 12 includes a selection signal generation section 121 and a selection signal transmission section 122. The selection signal generation section 121 is configured to receive a self refresh signal SREF generated at a logic high level in a self refresh mode and a power-down mode signal PDM generated at a logic high level in a power-down mode, and generate a selection signal SEL. The selection signal transmission section 122 includes transmission gates T11 and T12 which are selectively turned on in response to the selection signal SEL, and is configured to select a first or second reference voltage VREF1 or VREF2 as a selection reference voltage VREFSEL and output the selection reference voltage VREFSEL. Here, the first reference voltage VREF1 may have a higher level than the second reference voltage VREF2.

The selection unit 12 configured in such a manner outputs the first reference voltage VREF1 as the selection reference voltage VREFSEL when the internal voltage generation circuit enters the self refresh mode or the power-down mode. Here, the power-down mode may include a precharge power-down mode or a idle power-down mode. On the other hand, the selection unit 12 outputs the second reference voltage VREF2 as the selection reference voltage VREFSEL when the internal voltage generation circuit does not enter the self refresh mode and the power-down mode.

The driving signal generation unit 13 compares the fed-back negative word line voltage VNWL with the selection reference voltage VREFSEL and generates a driving signal which is enabled to a logic high level when the negative word line voltage VNWL is higher than the selection reference voltage VERFSEL.

The driving unit 14 is configured to drive the negative word line voltage VNWL to the back bias voltage VBB when the driving signal DRV enabled to a logic high level.

Figure 2:
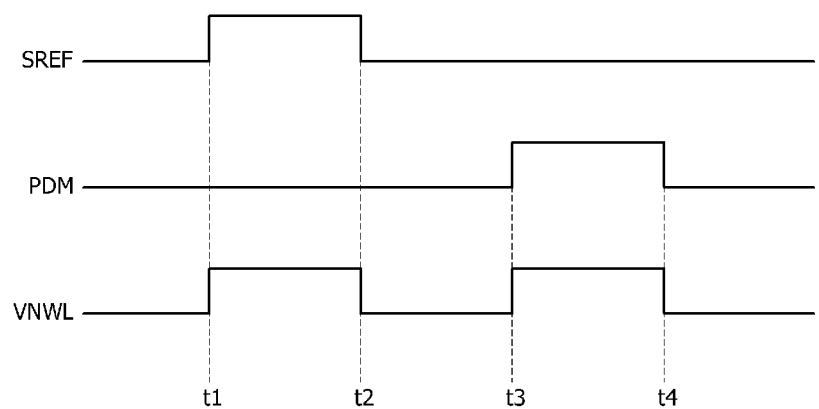
FIG. 2 is a waveform diagram showing the waveform of a negative word line voltage generated in the internal voltage generation circuit of FIG. 1.

The internal voltage generation circuit configured in such a manner compares the first reference voltage VREF1 with the negative word line voltage VNWL to drive the negative word line voltage VNWL, when the internal voltage generation circuit enters the self refresh mode or the power-down mode. On the other hand, the internal voltage generation circuit compares the second reference voltage VREF2 with the negative word line voltage VNWL to drive the negative word line voltage VNWL, when the internal voltage generation circuit does not enter the self refresh mode and the power-down mode. The first reference voltage VREF1 is set to a higher level than the second reference voltage VREF2. Therefore, as shown in FIG. 2, the level of the negative word line voltage VNWL increases during a period t1~t2 where the internal voltage generation circuit stays in the self refresh mode and a period t3~t4 where the internal voltage generation circuit stays in the power-down mode. Since the negative word line VNWL has a negative level, the absolute value decreases when the level increases.

Therefore, because the negative word line voltage VNWL is generated using the charge pump, as the absolute value of the negative word line voltage VNWL decreases, power consumption may decrease. Further, although a bridge occurs between a word line and a bit line in a state in which the internal voltage generation circuit stays in the self refresh mode or the power-down mode, the absolute value of the negative word line voltage VNWL decreases to thereby reduce a leakage current occurring due to the bridge.

Figure 3:
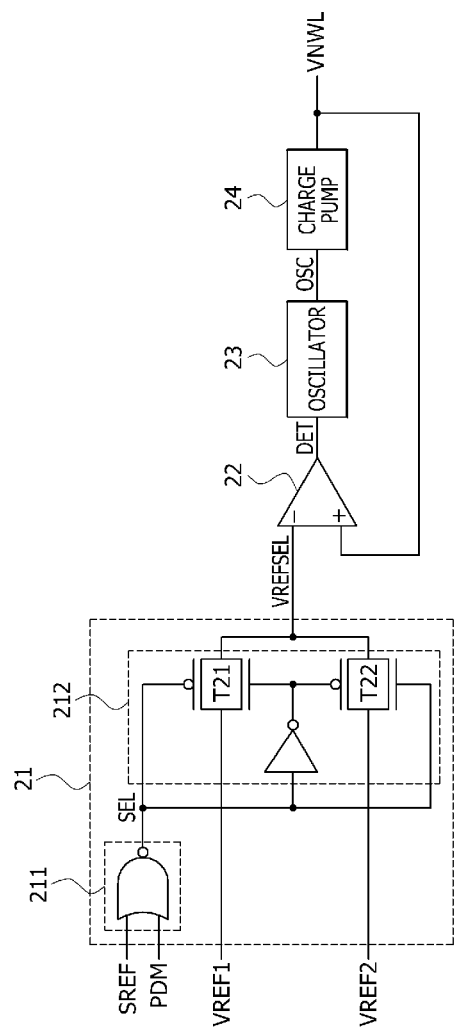
FIG. 3 is a circuit diagram of an internal voltage generation circuit in accordance with an embodiment of the present invention.

FIG. 3 is a circuit diagram of the internal voltage generation circuit in accordance with an embodiment of the present invention.

Referring to FIG. 3, the internal voltage generation circuit in accordance with an embodiment of the present invention includes a selection unit 21, a comparison unit 22, an oscillator 23, and a charge pump 24.

The selection unit 21 includes a selection signal generation section 211 and a selection signal transmission section 212. The selection signal generation section 211 is configured to receive a self refresh signal SREF and a power-down mode signal PDM and generate a selection signal SEL. The selection signal transmission section 212 includes transmission gates T21 and T22 which are selectively turned on in response to the selection signal SEL. Also, the selection signal transmission section 212 is configured to select the first or second reference voltage VREF1 or VREF2 as the selection reference voltage VREFSEL and output the selection reference voltage VREFSEL. Here, the first reference voltage VREF1 may have a higher level than the second reference voltage VERF2.

The comparison unit 22 is configured to generate a detection signal DET which is enabled to a logic high level when a fed-back negative word lines voltage VNWL is higher than a pumping reference voltage VREFP. The oscillator 23 is configured to generate a periodic signal OSC when the detection signal DET is enabled. The charge pump 24 is configured to pump the negative word line voltage VNWL when the periodic signal OSC is inputted.

The internal voltage generation circuit configured in such a manner compares the first reference voltage VREF1 with the negative word line voltage VNWL to drive the negative word line voltage VNWL, when the internal voltage generation circuit enters the self refresh mode or the power-down mode, and compares the second reference voltage VREF2 with the negative word line voltage VNWL to drive the negative word line voltage VNWL, when the internal voltage generation circuit does not enter the self refresh mode and the power-down mode. The first reference voltage VREF1 is set to a higher level than the second reference voltage VREF2. Therefore, when the internal voltage generation circuit enters the self refresh mode or the power-down mode, the level of the negative word line voltage VNWL increases.

Therefore, because the negative word line voltage VNWL is generated using the charge pump, as the absolute value of the negative word line voltage VNWL decreases, power consumption may decrease. Further, although a bridge occurs between a word line and a bit line in a state in which the internal voltage generation circuit stays in the self refresh mode or the power-down mode, the absolute value of the negative word line voltage VNWL decreases to thereby reduce a leakage current occurring due to the bridge.

The embodiments of the present invention have been disclosed above for illustrative purposes. Those skilled in the art will appreciate that various modifications, additions and substitutions are possible, without departing from the scope and spirit of the invention as disclosed in the accompanying claims.

What is claimed is:

1. An internal voltage generation circuit comprising:
   a selection unit configured to select one of first and second reference voltages as a selection reference voltage in response to a self refresh signal and a power-down mode signal and output the selection reference voltage;
   a driving signal generation unit configured to compare the selection reference voltage with a negative word line voltage applied to an unselected word line and generate a driving signal; and
   a driving unit configured to change the negative word line voltage in response to the driving signal,
   wherein the selection unit comprises a selection signal generation section configured to generate a selection signal enabled in a self refresh mode or in a power-down mode, a first transmission gate configured to transmit the first reference voltage as the selection reference voltage, and a second transmission gate configured to transmit the second reference voltage as the selection reference voltage.

2. The internal voltage generation circuit of claim 1, wherein the driving unit is configured to drive the negative word line voltage to a back bias voltage lower than a ground voltage, in response to the driving signal.

3. The internal voltage generation circuit of claim 1, wherein the selection unit outputs the first reference voltage having a higher level than the second reference voltage as the selection reference voltage, when the internal voltage generation circuit enters the self refresh mode according to the self refresh signal or enters the power-down mode according to the power-down mode signal.

4. The internal voltage generation circuit of claim 1, wherein the driving signal generation unit generates the driving signal which is enabled when the negative word line voltage has a higher level than the selection reference voltage.

5. The internal voltage generation circuit of claim 1, further comprising a pumping circuit configured to compare the back bias voltage with a pumping reference voltage and pump the back bias voltage.

6. The internal voltage generation circuit of claim 5, wherein the pumping circuit comprises:
   a comparison section configured to compare the back bias voltage with the pumping reference voltage and generate a detection signal;
   an oscillator configured to generate a periodic signal in response to the detection signal; and
   a charge pump configured to pump the back bias voltage in response to the periodic signal.

7. The internal voltage generation circuit of claim 6, wherein the comparison section generates the detection signal having a preset period when the back bias voltage has a higher level than the pumping reference voltage.

8. An internal voltage generation circuit comprising:
   a selection unit configured to select one of first and second reference voltages as a selection reference voltage in response to a self refresh signal and a power-down mode signal and output the selection reference voltage;
   a comparison unit configured to compare the selection reference voltage with a negative word line voltage applied to an unselected word line and generate a detection signal;
   an oscillator configured to generate a periodic signal in response to the detection signal; and
   a charge pump configured to pump the negative word line voltage in response to the periodic signal,
   wherein the selection unit comprises a selection signal generation section configured to generate a selection signal enabled in a self refresh mode or in a power-down mode, a first transmission gate configured to transmit the first reference voltage as the selection reference voltage, and a second transmission gate configured to transmit the second reference voltage as the selection reference voltage.

9. The internal voltage generation circuit of claim 8, wherein the selection unit outputs the first reference voltage having a higher level than the second reference voltage as the selection reference voltage, when the internal voltage generation circuit enters the self refresh mode according to the self refresh signal or enters the power-down mode according to the power-down mode signal.

10. The internal voltage generation circuit of claim 8, wherein the comparison unit generates the detection signal which is enabled when the negative word line voltage has a higher level than the selection reference voltage.

* * * * *